US009577009B1

(12) United States Patent
Shih et al.

(10) Patent No.: US 9,577,009 B1
(45) Date of Patent: Feb. 21, 2017

(54) RRAM CELL WITH PMOS ACCESS TRANSISTOR

(71) Applicant: Taiwan Semiconductor Manufacturing Co., Ltd., Hsin-Chu (TW)

(72) Inventors: Sheng-Hung Shih, Hsinchu (TW);
Kuo-Chi Tu, Hsin-Chu (TW);
Chih-Yang Chang, Yuanlin Township (TW); Hsia-Wei Chen, Taipei (TW);
Chin-Chieh Yang, New Taipei (TW);
Jen-Sheng Yang, Keelung (TW);
Wen-Ting Chu, Kaohsiung (TW);
Yu-Wen Liao, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/940,421

(22) Filed: Nov. 13, 2015

(51) Int. Cl.
*H01L 27/24* (2006.01)
*H01L 45/00* (2006.01)
*G11C 5/14* (2006.01)

(52) U.S. Cl.
CPC .......... *H01L 27/2436* (2013.01); *G11C 5/145* (2013.01); *G11C 5/147* (2013.01); *H01L 27/2427* (2013.01);
(Continued)

(58) Field of Classification Search
None
See application file for complete search history.

(56) References Cited

U.S. PATENT DOCUMENTS 6,677,806 B2 1/2004 Bloch
7,660,169 B2 2/2010 Otterstedt et al.
(Continued)

FOREIGN PATENT DOCUMENTS

WO 0161855 A1 8/2001

OTHER PUBLICATIONS

Xu, Cong, Dimin Niu, Naveen Muralimanohar, Rajeev Balasubramonian, Tao Zhang, Shimeng Yu, and Yuan Xie. "Overcoming the Challenges of Crossbar Resistive Memory Architectures." 2015 IEEE 21st International Symposium on High Performance Computer Architecture (HPCA) (2015).*
(Continued)

*Primary Examiner* — Joseph Schoenholtz
(74) *Attorney, Agent, or Firm* — Eschweiler & Associates, LLC

(57) ABSTRACT

The present disclosure relates to an integrated chip comprising an RRAM cell that is driven by a PMOS transistor, and an associated method of formation. In some embodiments, the integrated chip has a PMOS transistor arranged within a semiconductor substrate. A resistive RRAM cell is arranged within an inter-level dielectric (ILD) layer overlying the semiconductor substrate. The RRAM cell has a first conductive electrode separated from a second conductive electrode by a dielectric data storage layer having a variable resistance. The first conductive electrode is connected to a drain terminal of the PMOS transistor by one or more metal interconnect layers. The use of a PMOS transistor to drive the RRAM cell allows for impact of the body effect to be reduced and therefore allows for a reset operation to be performed at a low power and in a short amount of time.

20 Claims, 7 Drawing Sheets

(52) U.S. Cl.
CPC ....... *H01L 27/2481* (2013.01); *H01L 45/1233* (2013.01); *H01L 45/16* (2013.01)

(56) References Cited

U.S. PATENT DOCUMENTS

| | | | | |
|---|---|---|---|---|
| 2010/0265757 | A1* | 10/2010 | Otsuka | G11C 13/0009 365/148 |
| 2010/0283028 | A1* | 11/2010 | Brubaker | H01L 27/2409 257/2 |
| 2012/0206976 | A1* | 8/2012 | Aoki | G11C 16/0483 365/185.22 |
| 2013/0077383 | A1* | 3/2013 | Huang | G11C 13/0004 365/148 |
| 2014/0264222 | A1* | 9/2014 | Yang | H01L 29/66659 257/2 |
| 2015/0003142 | A1 | 1/2015 | Chung | |
| 2015/0003143 | A1 | 1/2015 | Chung | |
| 2015/0023100 | A1 | 1/2015 | Huynh et al. | |
| 2015/0138871 | A1* | 5/2015 | Lee | G11C 13/0069 365/148 |
| 2015/0144859 | A1 | 5/2015 | Chen et al. | |
| 2015/0371705 | A1* | 12/2015 | Onkaraiah | G11C 13/0007 327/208 |
| 2016/0111156 | A1* | 4/2016 | Chiu | G11C 13/0069 365/148 |

OTHER PUBLICATIONS

Chapter 2, MOS Transistors, CSE 3142 Monash University. 2006, downloaded from URL<http://www.csse.monash.edu.au/courseware/cse3142/2006/Lnts/C02.pdf> on May 4, 2016.*
Coen 180. "Flash Memory: Floating Gate Basics." Copyright 2003. Retrieved on Jul. 1, 2015 from http://www.cse.scu.edu/~tschwarz/coen180/LN/flash.html.
Clark, Robert D. "Emerging Applications for High K Materials in VLSI Technology." Materials 2014, 7(4), pp. 2913-2944. Published Apr. 10, 2014.
Body Effect: What Do You Need to Know to Understand This Topic? Retrieved on Jul. 1, 2015 from: http://www.onmyphd.com/?p=body.effect.

* cited by examiner

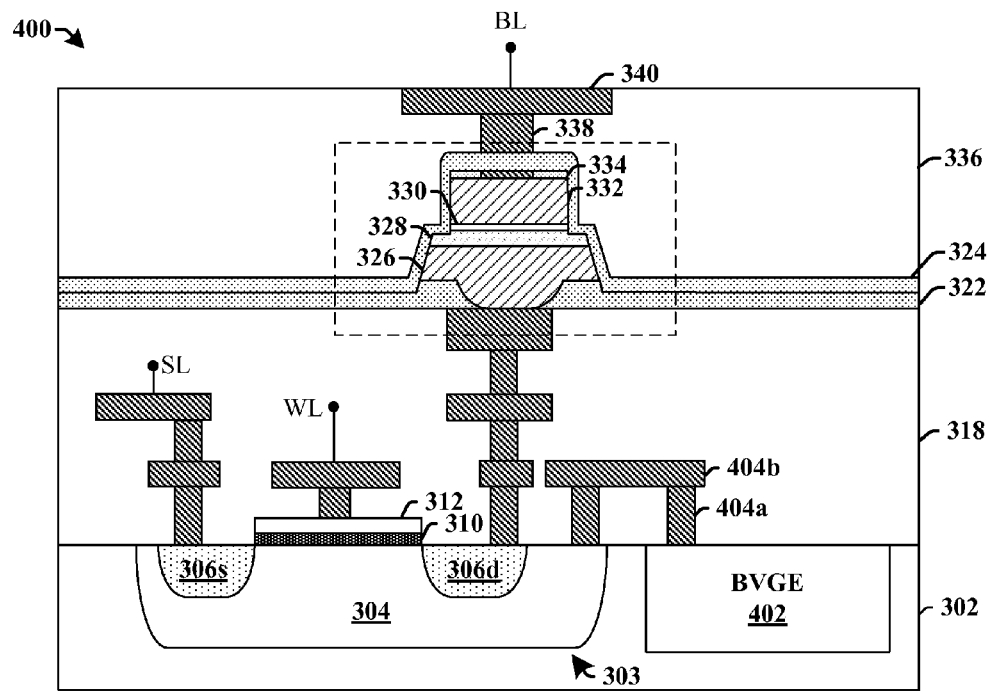
Fig. 4
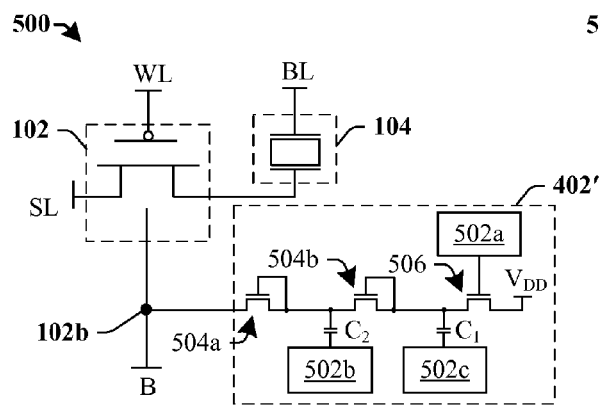      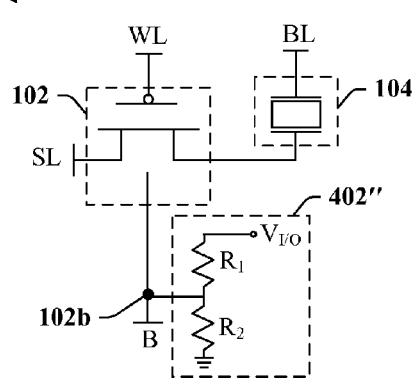
Fig. 5A              Fig. 5B

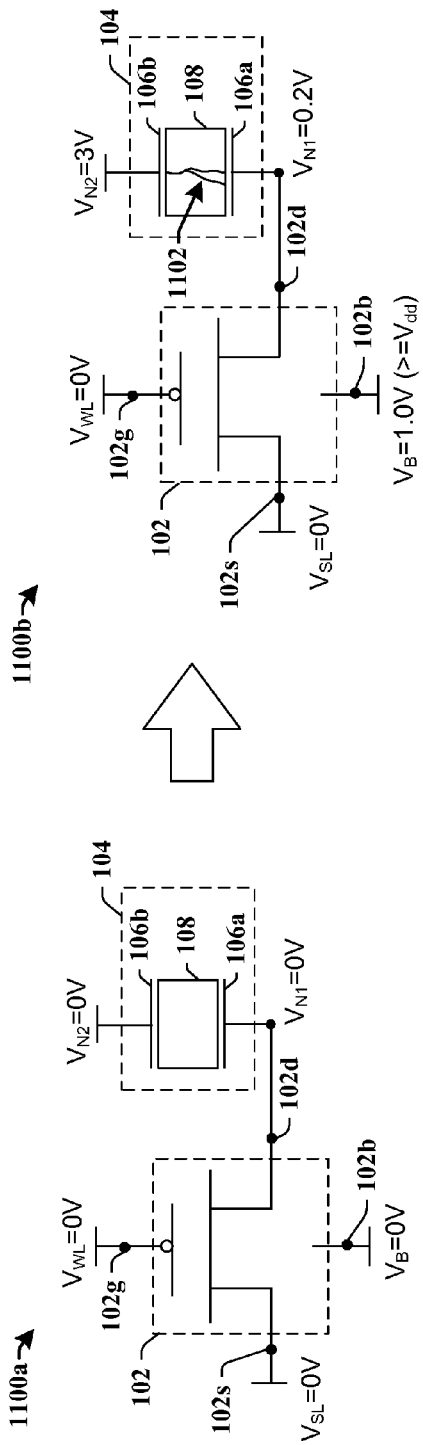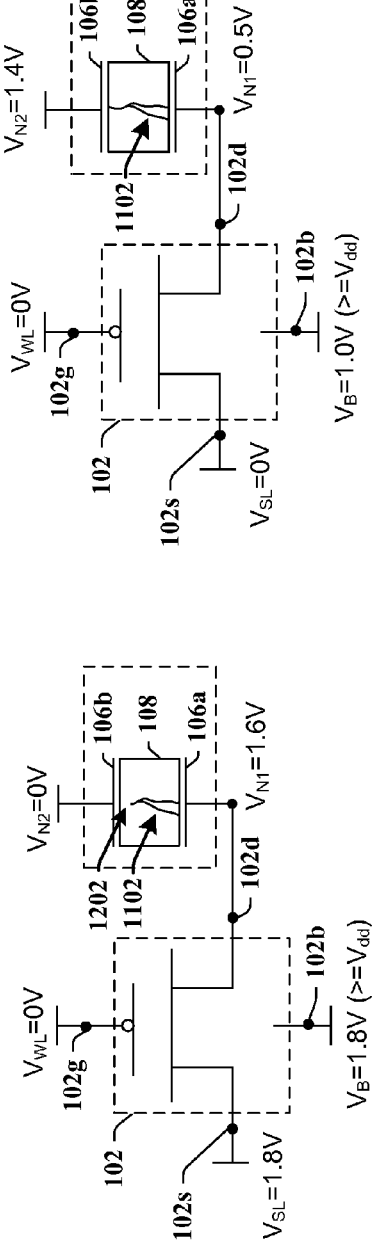
Fig. 11
Fig. 12A
Fig. 12B

RRAM CELL WITH PMOS ACCESS TRANSISTOR

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one candidate for next generation non-volatile memory technology due to its simple structure and CMOS logic compatible process technology that is involved. An RRAM cell includes a dielectric data storage layer having a variable resistance, which is arranged between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates some additional embodiments of a cross-sectional view of an integrated chip comprising an RRAM cell driven by a PMOS transistor.

FIGS. 5A-5B illustrate some additional embodiments of schematic diagrams of an integrated chip comprising an RRAM cell driven by a PMOS transistor.

FIGS. 7-12B illustrate some embodiments of cross-sectional views showing a method of forming and operating an integrated chip comprising an RRAM cell driven by a PMOS transistor.

DETAILED DESCRIPTION

Figure 1:
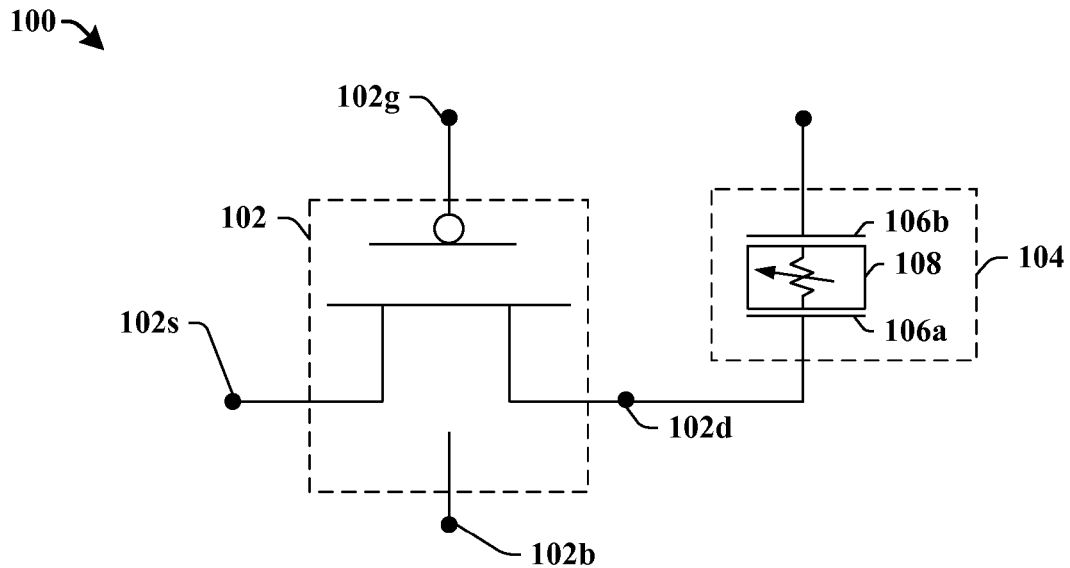
FIG. 1 illustrates some embodiments of a schematic diagram of an integrated chip comprising a resistive random access memory (RRAM) cell driven by a PMOS transistor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells include a dielectric data storage layer disposed between conductive electrodes. Depending on voltage values that are applied to the conductive electrodes, the dielectric data storage layer will undergo a reversible change between a high resistance state associated with a first data state (e.g., a '0') and a low resistance state associated with a second data state (e.g., a '1'). Once the dielectric data storage layer achieves a data state, it will remain in the data state until voltage values are applied to the conductive electrodes to induce a 'reset' operation (changing the dielectric data storage layer to a high resistance state) or a 'set' operation (changing the dielectric data storage layer to a low resistance state).

Typically, in a 1T1R (1 transistor, 1 resistor) architecture, the 'reset' operation of an RRAM cell is driven by an NMOS transistor. For the NMOS transistor to provide a sufficient voltage to perform a reset operation, the voltage applied to a gate terminal of the NMOS transistor has to exceed a voltage applied to a source terminal of the NMOS transistor by at least a threshold voltage ($V_{TH}$). In recent technology nodes (e.g., 32 nm, 28 nm, 22 nm, etc.), the voltage applied to the gate terminal of an NMOS transistor has increased due to a greater impact of the body effect, which increases a threshold voltage of a MOSFET by an amount proportional to a voltage difference between a source and a bulk. The increased voltage applied to the gate terminal of the NMOS transistor increases power consumption of an integrated chip and also increases a time required for the RRAM cell to undergo the perform the reset operation.

Accordingly, the present disclosure relates to an integrated chip comprising an RRAM cell that is driven by a PMOS transistor, and an associated method of formation. In some embodiments, the integrated chip comprises a PMOS transistor arranged within a semiconductor substrate. A resistive RRAM cell is arranged within an inter-level dielectric (ILD) layer overlying the semiconductor substrate. The RRAM cell has a first conductive electrode separated from a second conductive electrode by a dielectric data storage layer having a variable resistance. The first conductive electrode is connected to a drain terminal of the PMOS transistor by one or more metal interconnect layers. The use of a PMOS transistor to drive the RRAM cell allows for impact of the body effect to be reduced and therefore allows for a reset operation to be performed at a low power and in a short amount of time (e.g., less than 1 ms).

FIG. 1 illustrates some embodiments of a schematic diagram of an integrated chip 100 comprising an RRAM cell driven by a PMOS transistor.

The integrated chip 100 comprises a PMOS transistor 102. The PMOS transistor 102 has a source terminal 102*s*, a drain terminal 102*d*, a gate terminal 102*g*, and a bulk terminal 102*b*. The drain terminal 102*d* of the PMOS transistor 102 is connected to a resistive random access memory (RRAM) cell 104. The RRAM cell 104 has a first conductive electrode 106a separated from a second conductive electrode 106b by a dielectric data storage layer 108 having a variable resistance. Depending on voltages applied to the first conductive electrode 106a and the second conductive electrode 106b, the dielectric data storage layer 108 will undergo a reversible change between a high resistance state associated with a first data state (e.g., a '0') and a low resistance state associated with a second data state (e.g., a '1').

The gate voltage of the PMOS transistor 102 is less affected by bias voltages applied to the bulk terminal 102b than an NMOS transistor, thereby allowing for the bulk terminal 102b to be biased by an amount that allows for a voltage difference between the source terminal 102s and the bulk terminal 102b to be reduced. The reduced voltage difference between the source terminal 102s and the bulk terminal 102b reduces the body effect. Reducing the body effect allows for the PMOS transistor 102 to be turned on (e.g., a conductive channel can be formed in the PMOS transistor 102) by applying a small (e.g., substantially zero) bias voltage to the gate terminal 102g, thereby enables the integrated chip 100 to perform a reset operation on the RRAM cell 104 at a low power and in a short amount of time (e.g., less than 1 ms).

Figure 2A:
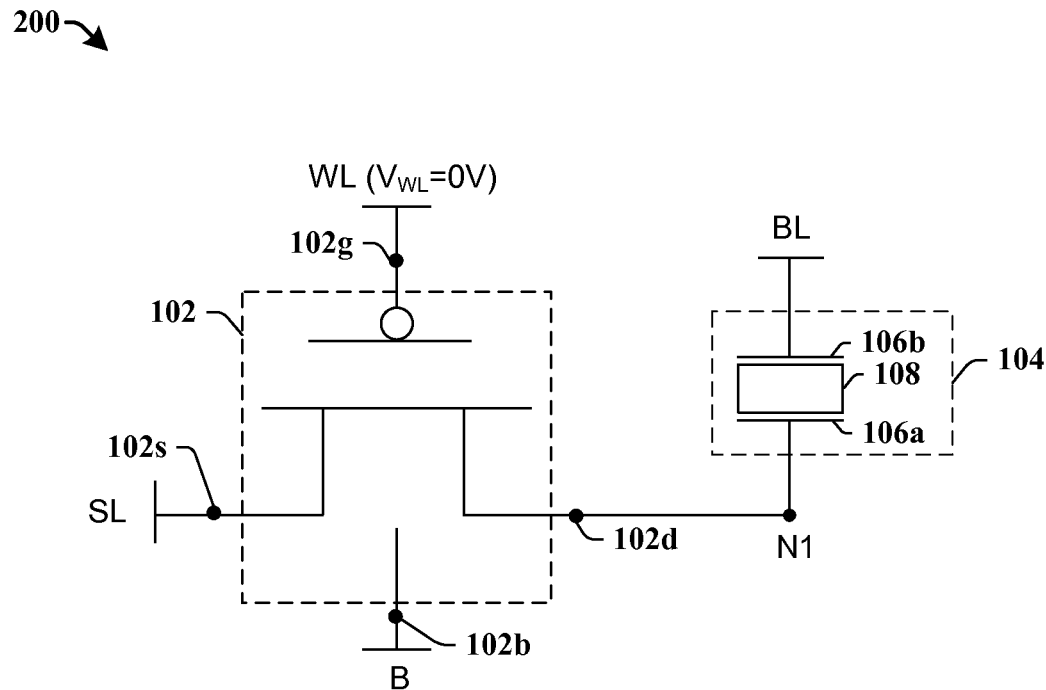
FIGS. 2A-2B illustrate some additional embodiments of an integrated chip comprising an RRAM cell driven by a PMOS transistor.
Figure 2B:
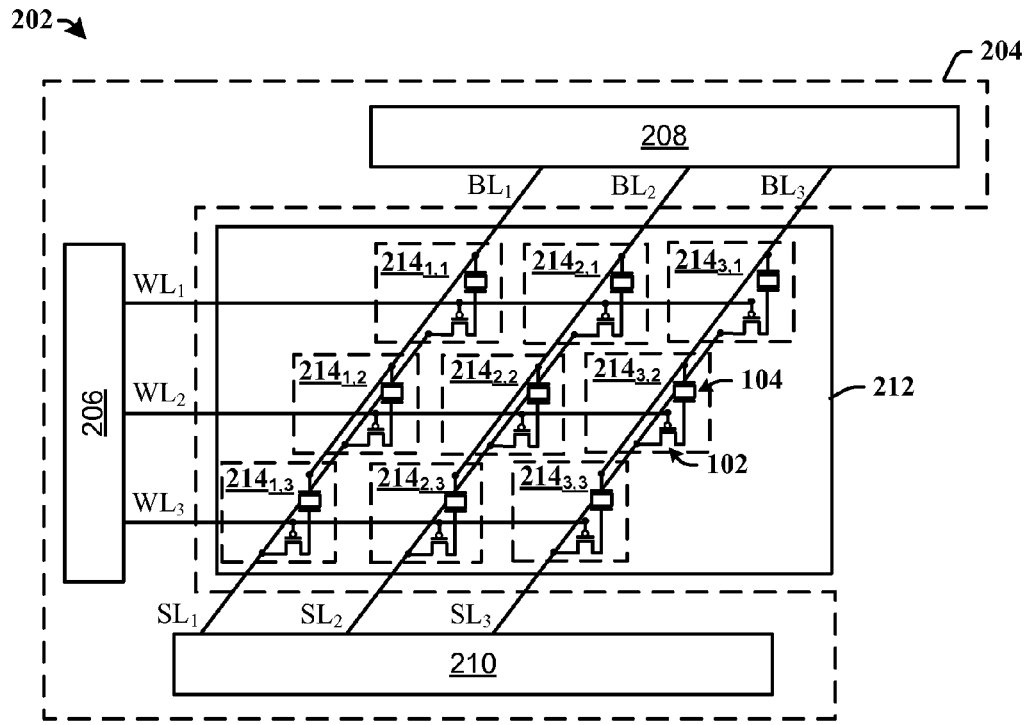

FIGS. 2A-2B illustrate some additional embodiments of an integrated chip comprising an RRAM cell driven by a PMOS transistor.

FIG. 2A illustrates a schematic diagram of an integrated chip 200 comprising an RRAM cell driven by a PMOS transistor.

The integrated chip 200 comprises a PMOS transistor 102 having a bulk terminal 102b (i.e., a back terminal or a body terminal) coupled to a substrate (not shown) comprising the PMOS transistor 102 (i.e., to the bulk of the substrate comprising a source and drain of the PMOS transistor). The PMOS transistor 102 further comprises a source terminal 102s connected to a source-line SL, a gate terminal 102g connected to a word-line WL, and a drain terminal 102d connected to a first conductive electrode 106a of an RRAM cell 104. The first conductive electrode 106a is separated from a second conductive electrode 106b by a dielectric data storage layer 108 having a variable resistance. The second conductive electrode 106b is connected to a bit-line BL.

Since the RRAM cell 104 is accessed by the PMOS transistor 102 (i.e., the PMOS transistor acts as a access transistor for read and/or write operations to the RRAM cell 104), a bias voltage of substantially zero volts may be applied to the word-line WL to turn on the PMOS transistor 102, thereby allowing charge carriers to flow from the source terminal 102s to the drain terminal 102d and resulting in a voltage $V_1$ at a node $N_1$ coupled to the second conductive electrode 106b. The bit-line BL may be held at a second voltage $V_2$. If the first voltage $V_1$ is larger than the second voltage $V_2$, a potential difference is generated between the first and second conductive electrodes, 106a and 106b, which removes ions from the dielectric data storage layer 108, resulting in the formation of vacancies that form a conductive filament within the dielectric data storage layer 108. If the first voltage $V_1$ is smaller than the second voltage $V_2$, a potential difference is generated between the first and second conductive electrodes, 106a and 106b, which moves ions to the dielectric data storage layer 108, eliminating vacancies of the conductive filament and breaking the conductive filament.

As shown in the top-view 202 of FIG. 2B, the word-line WL, the bit-line BL, and the source-line SL are coupled to control circuitry 204. In some embodiments, the control circuitry 204 comprises a row decoder 206 coupled to the word-line WL, a column decoder 208 coupled to the bit-line BL, and a source-line driver 210 coupled to the source-line SL. The row decoder 206 is configured to selectively apply bias voltages to the word-line WL. Concurrently, the column decoder 208 is configured to selectively apply bias voltages to the bit-line BL and the source-line driver 210 is configured to selectively apply bias voltages to the source-line SL. By applying bias voltages to selective word-lines WL, bit-lines BL, and source-lines SL, the RRAM memory cells can be operated to store different data states.

In some embodiments, the word-lines WL, the bit-lines BL, and the source-lines SL may be connected to a plurality of RRAM memory devices 214 arranged in a grid layout within a memory array 212. For example, the word-lines WL may be coupled to the gate terminals of multiple PMOS transistors connected to RRAM cells 104 along a row of the memory array 212 (e.g., word-line $WL_1$ is connected to PMOS transistors in RRAM memory devices $214_{1,1}$-$214_{3,1}$). The source-lines SL may be coupled to the source terminals of multiple PMOS transistors connected to RRAM cells 104 along a column of the memory array 212 (e.g., source-line $SL_1$ is connected to PMOS transistors in RRAM memory devices $214_{1,1}$-$214_{1,3}$). The bit-lines BL may be connected to the second conductive electrodes of multiple RRAM cells along a column of the memory array 212 (e.g., bit-line $BL_1$ is connected to second conductive electrode of RRAM cells in RRAM memory devices $214_{1,1}$-$214_{1,3}$). In some embodiments, the word-lines WL may extend in a first direction, while the bit-lines BL extends in a second direction perpendicular to the first direction.

Figure 3:
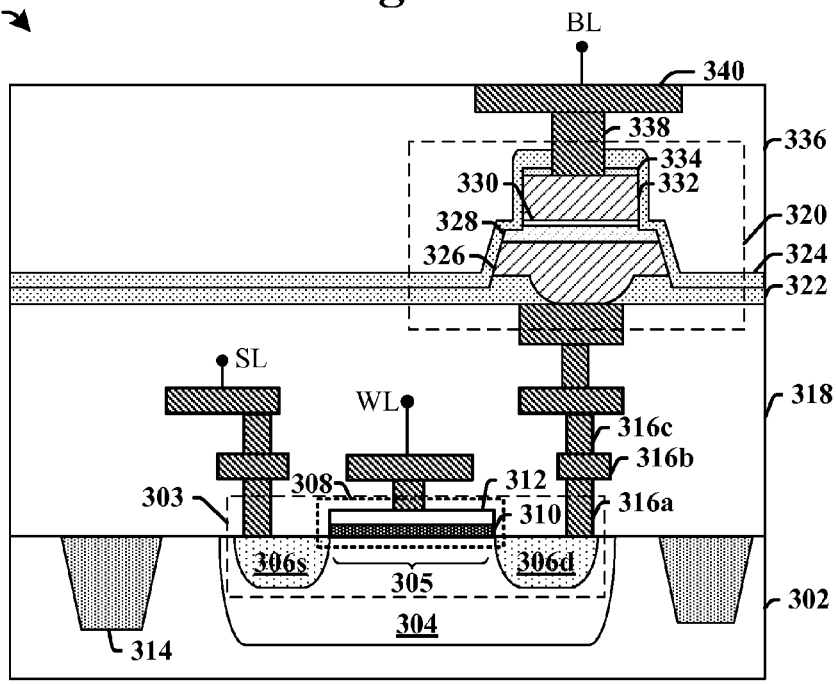
FIG. 3 illustrates some embodiments of a cross-sectional view of an integrated chip comprising an RRAM cell driven by a PMOS transistor.

FIG. 3 illustrates some embodiments of a cross-sectional view of an integrated chip 300 comprising an RRAM cell driven by a PMOS transistor.

The integrated chip 300 comprises a well region 304 having n-type dopants disposed within a semiconductor substrate 302 having p-type dopants. A PMOS transistor 303 is arranged within the well region 304. The PMOS transistor 303 comprises a source region 306s that is separated from a drain region 306d by a channel region 305. The source region 306s and the drain region 306d comprise highly doped regions having p-type dopants. A gate region 308 comprises a gate electrode 312 separated from the channel region 305 by a gate dielectric layer 310. In some embodiments, the PMOS transistor 303 may be arranged between isolation regions 314 (e.g., shallow trench isolation regions) within the semiconductor substrate 302.

The threshold voltage $V_{TH}$ of the PMOS transistor 303 is proportional to an initial threshold voltage $V_{T0}$ (e.g., the threshold voltage at a body bias voltage of 0) plus the square root of the difference in voltage potential between the bulk terminal and the source terminal (i.e., $V_{TH}=V_{T0}+\gamma\sqrt{(2\phi_f+V_{BS})}-\sqrt{(2\phi_f)}$, where $\gamma$ is a process parameter called body-effect parameter, and $\phi_f$ is a physical parameter). Therefore, biasing the well region 304 (e.g., corresponding to bulk terminal 102b or FIG. 1) with a voltage that is close to a voltage potential of the source region 306s reduces the body effect, so that a conductive channel can form between the source region 306s and the drain region 306d when a word-line voltage of approximately zero volts is applied to the gate electrode 312.

A back-end-of-the-line (BEOL) metallization stack is arranged within an ILD layer 318 over the semiconductor substrate 302. In some embodiments, the ILD layer 318 may comprise one or more layers of an oxide, a low-k dielectric, or an ultra low-k dielectric. The BEOL metallization stack comprises a plurality of contacts 316a, metal wire layers 316b, and metal via layers 316c. In some embodiments, the plurality of contacts 316a, metal wire layers 316b, and metal via layers 316c may comprise copper, tungsten, and/or aluminum. The metal wire layers 316b comprise a source-line SL comprising a first metal interconnect wire that is electrically coupled to a source region 306s of the PMOS transistor 303. In some embodiments, the source-line SL may be arranged in a second metal wire layer that is connected to source region 306s through a contact, a first metal wire layer, and a first metal via layer. The metal wire layers 316b further comprise a word-line WL comprising a second metal interconnect wire that is electrically coupled to a gate electrode 312 of the PMOS transistor 303. In some embodiments, the word-line WL may be arranged in the first metal wire layer that is connected to gate electrode 312 by way of a contact.

An RRAM cell 320 is arranged within the BEOL metallization stack at a location that is vertically between metal interconnect layers. The RRAM cell 320 is vertically separated from the ILD layer 318 by a bottom dielectric layer 322. In some embodiments, the bottom dielectric layer 322 may comprise silicon carbide (SiC) or silicon nitride (SiN), for example. The RRAM cell 320 comprises a bottom electrode 326 directly connected to the drain region 306d by a plurality of metal interconnect layers. In some embodiments, the bottom electrode 326 comprises a flat top surface connected to a bottom surface by way of curved sidewalls (i.e., sidewalls having a slope that changes as a function of height). In some embodiments, the bottom surface may also be curved, such that the sidewalls and the bottom surface form a continuous curved surface that extends between opposing sides of the top surface. In various embodiments, the bottom electrode 326 may comprise a metal nitride or a metal. For example, in some embodiments, the bottom electrode 326 may comprise titanium nitride (TiN) or tantalum nitride (TaN). In other embodiments, the bottom electrode 326 may comprise tungsten (W) or copper (Cu).

A variable resistance dielectric data storage layer 328, which is configured to store a data state depending on an applied voltage, is located over the bottom electrode 326. In some embodiments, the dielectric data storage layer 328 may comprise a high-k dielectric material. For example, in various embodiments, the dielectric data storage layer 328 may comprise hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$).

A top electrode 332 is disposed over the dielectric data storage layer 328. In some embodiments, the top electrode 332 may comprise TiN, TaN, W, or Cu. In some embodiments, a capping layer 330 may be arranged between the dielectric data storage layer 328 and the top electrode 332. The capping layer 330 is configured to store oxygen, which can facilitate resistance changes within the dielectric data storage layer 328. In some embodiments, the capping layer 330 may comprise a metal or a metal oxide that is relatively low in oxygen concentration. For example, in some embodiments, the capping layer 330 may comprise a metal such as titanium (Ti), hafnium (Hf), platinum (Pt), and/or aluminum (Al). In other embodiments, the capping layer 330 may comprise a metal oxide such as titanium oxide ($TiO_x$), hafnium oxide ($HfO_x$), zirconium oxide ($ZrO_x$), germanium oxide ($GeO_x$), cesium oxide ($CeO_x$)

In some embodiments, a hard mask layer 334 may be arranged onto the top electrode 332, and a top dielectric layer 324 may be arranged over the hard mask layer 334. The top dielectric layer 324 continuously extends from a position overlying the hard mask layer 334 to positions abutting sidewalls of the top electrode 332 and the dielectric data storage layer 328. The top dielectric layer 324 separates the hard mask layer 334, the top electrode 332, and the dielectric data storage layer 328 from an upper ILD layer 336 surrounding an overlying upper metal via 338 and an upper metal wire 340.

FIG. 4 illustrates some additional embodiments of a cross-sectional view of an integrated chip 400 comprising an RRAM cell driven by a PMOS transistor.

The integrated chip 400 comprises a bulk voltage generation element 402. The bulk voltage generation element 402 is arranged within a semiconductor substrate 302 and is electrically coupled to a well region 304 (e.g., corresponding to bulk terminal 102b or FIG. 1) of a PMOS transistor 303. In some embodiments, the bulk voltage generation element 402 may be electrically coupled to a well region 304 by way of one or more metal interconnect layers 404a-404b disposed within ILD layer 318. The bulk voltage generation element 402 is configured to apply a non-zero bias voltage to the well region 304. By applying a non-zero bias voltage to the well region 304, the body effect of the PMOS transistor 303 can be reduced. In some embodiments, the bulk voltage generation element 402 is configured to generate a non-zero bias voltage that is greater than or equal to a voltage potential at a drain region 306d (i.e., $V_{dd}$). Applying a non-zero bias voltage to the well region 304 having a value that is greater than or equal to the drain voltage ($V_{dd}$) isolates the well region 304 from the semiconductor substrate 302 due to junction isolation, and thereby reduces a threshold voltage of the PMOS transistor 303.

FIGS. 5A-5B illustrate some additional embodiments of schematic diagrams of an integrated chip comprising an RRAM cell driven by a PMOS transistor.

FIG. 5A illustrates some embodiments of a schematic diagram of an integrated chip 500 comprising a bulk voltage generation element 402' having a charge pump. The charge pump comprises a first NMOS transistor 506 having a drain connected to a supply voltage $V_{DD}$, a source connected to a first electrode of a first capacitor $C_1$, and a gate (i.e., a control terminal) connected to a first voltage multiplier circuit 502a. Additional voltage multiplier circuits 502b-502c are connected between downstream diode devices 504a and 504b (illustrated as diode connected NMOS transistors), and are configured to further increase the voltage value of the output signal $V_{out}$ provided to the bulk terminal 102b of the PMOS transistor 102 by increasing the charge output by each capacitor $C_1$-$C_2$ during pumping.

FIG. 5B illustrates some embodiments of a schematic diagram of an integrated chip 508 comprising a bulk voltage generation element 402" having a voltage divider. The voltage divider comprises a first resistor $R_1$ and a second resistor $R_2$ connected in series. The first resistor $R_1$ has a first terminal and a second terminal. The first terminal is connected to an input/output voltage $V_{I/O}$. The second terminal is connected to the second resistor $R_2$ and to the bulk terminal 102b of the PMOS transistor 102. The second resistor $R_2$ has a first terminal that is connected to the second terminal of the first resistor $R_1$ and second terminal connected to ground. When the voltage divider receives an I/O voltage $V_{I/O}$, it will output a voltage that is a fraction of the I/O voltage $V_{I/O}$ to the bulk terminal 102b of the PMOS transistor 102. For example, the voltage divider will output a voltage to the bulk terminal 102b that is equal to $R_2/(R_1+R_2)*V_{I/O}$.

Figure 6:
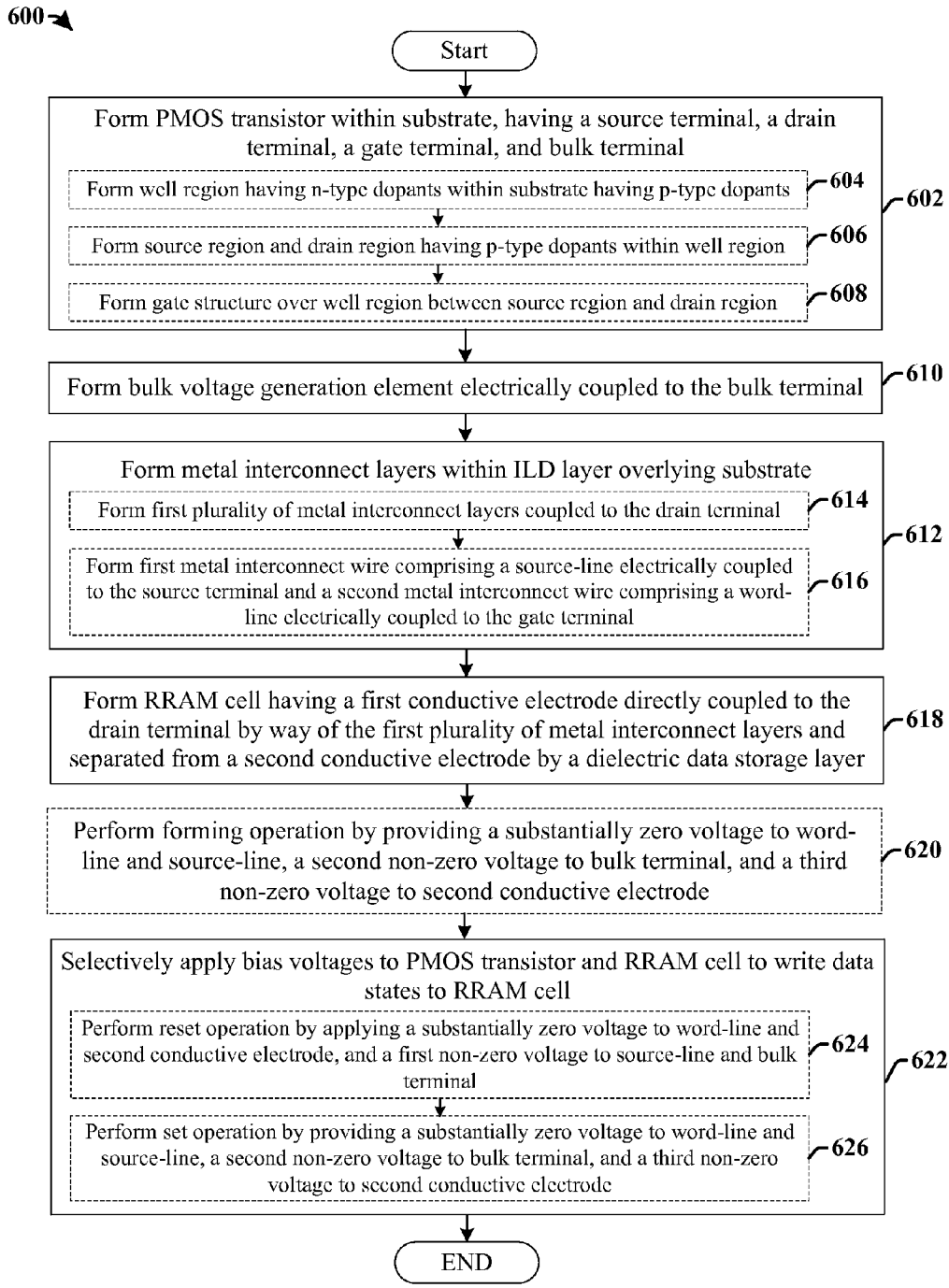
FIG. 6 illustrates a flow diagram of some embodiments of a method of forming and operating an integrated chip comprising an RRAM cell driven by a PMOS transistor.

FIG. 6 illustrates a flow diagram of some embodiments of a method 600 of forming and operating an integrated chip comprising an RRAM cell driven by a PMOS transistor.

While the disclosed method 600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a PMOS transistor is formed within a substrate. The PMOS transistor comprises a source terminal, a drain terminal, a gate terminal, and a bulk terminal. In some embodiments, the PMOS transistor may be formed according to acts 604-608.

At 604, a well region having n-type dopants is formed within a substrate having p-type dopants.

At 606, a source region and a drain region having p-type dopants are formed within the well region.

At 608, a gate structure is formed over the well region at a location between the source region and the drain region. The gate structure comprises a gate electrode separated from the well region by a gate dielectric layer.

At 610, a bulk voltage generation element is formed within the substrate. The bulk voltage generation element is electrically coupled to the bulk terminal of the PMOS transistor.

At 612, metal interconnect layers are formed within an inter-level dielectric (ILD) layer overlying the substrate. In some embodiments, the one or more metal interconnect layers may be formed according to acts 614-616.

At 614, a first plurality of metal interconnect layers coupled to the drain terminal of the PMOS transistor are formed within the ILD layer.

At 616, a first metal interconnect wire is formed comprising a source-line electrically coupled to the source terminal and a second metal interconnect wire is formed comprising a word-line electrically coupled to the gate terminal.

At 618, a resistive random access memory (RRAM) cell is formed. The RRAM cell has a first conductive electrode that is directly coupled to the drain terminal by way of the first plurality of metal interconnect layers. The first conductive electrode is separated from a second conductive electrode by a dielectric data storage layer.

At 620, a forming operation is performed by providing a substantially zero voltage to the word-line and the source-line, a second non-zero voltage to the bulk terminal, and a third non-zero voltage to the second conductive electrode. The forming operation forms a conductive filament or path within the dielectric data storage layer. Once the filament is formed, it may be subsequently reset (broken, resulting in high resistance) or set (re-formed, resulting in lower resistance) to store data states.

At 622, bias voltages are selectively applied to the PMOS transistor and the RRAM cell to write data states to the RRAM cell. In various embodiments, the bias voltages may be selectively applied according to acts 624-626.

At 624, a reset operation is performed by applying a substantially zero voltage to the word-line and the second conductive electrode, and a first non-zero voltage to the source-line and the bulk terminal. The reset operation changes the dielectric data storage layer from a low resistive state to a high resistive state.

At 626, a set operation is performed by providing a substantially zero voltage to the word-line and the source-line, a second non-zero voltage to the bulk terminal, and a third non-zero voltage to the second conductive electrode. The set operation changes the dielectric data storage layer from a high resistive state to a low resistive state.

FIGS. 7-12B illustrate some embodiments of a method of forming and operating an integrated chip comprising an RRAM cell driven by a PMOS transistor. Although FIGS. 7-12B are described in relation to method 600, it will be appreciated that the structures disclosed in FIGS. 7-12B are not limited to such a method, but instead may stand alone as structures independent of the method.

Figure 7:
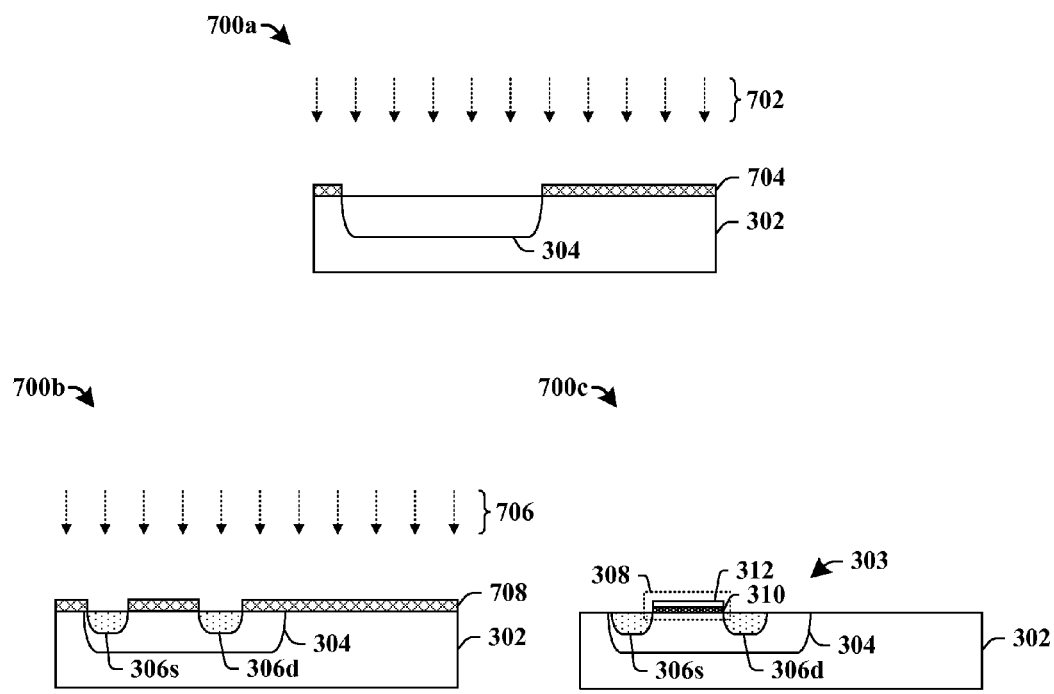

FIG. 7 illustrates some embodiments of cross-sectional views, 700a-700c, of an integrated chip corresponding to act 602. Cross-sectional views, 700a-700c, illustrate one non-limiting embodiment of the formation of a PMOS transistor 303, which forms a well region 304 having n-type dopants within a semiconductor substrate 302 having p-type dopants. However, it will be appreciated that in alternative embodiments, the PMOS transistor may be formed by forming source and drain regions having p-type dopants into a semiconductor substrate having n-type dopants.

As shown in cross-sectional view 700a, a well region 304 is formed within a semiconductor substrate 302. In various embodiments, the semiconductor substrate 302 may comprise any type of semiconductor body (e.g., silicon, SiGe, SOI) such as a semiconductor wafer and/or one or more die on a wafer, as well as any other type of semiconductor and/or epitaxial layers associated therewith. In some embodiments the semiconductor substrate 302 comprises p-type dopants. The well region 304 is formed by selectively implanting an n-type dopant species 702 (e.g., phosphorous, arsenic, etc.) into areas of the semiconductor substrate 302 not masked by the masking layer 704. In some embodiments, the n-type dopant species 702 may be subsequently driven into the semiconductor substrate 302 using a high temperature anneal.

As shown in cross-sectional view 700b, a source region 306s and a drain region 306d are formed within the well region 304. The source region 306s and the drain region 306d may be formed by selectively implanting a p-type dopant species 706 (e.g., boron, aluminum, etc.) into areas of the semiconductor substrate 302 not masked by the masking layer 708. In some embodiments, the p-type dopant species 706 may be subsequently driven into the semiconductor substrate 302 using a high temperature anneal.

As shown in cross-sectional view 700c, a gate region 308 is formed over a channel region 305. The gate region 308 comprises a gate dielectric layer 310 and an overlying gate electrode 312. In some embodiments, the gate region 308 may be formed by deposition processes and one or more subsequent patterning processes.

Figure 8:
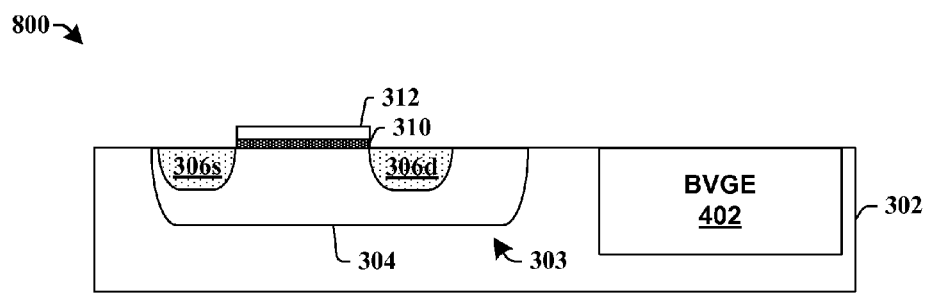

FIG. 8 illustrates some embodiments of a cross-sectional view 800 of an integrated chip corresponding to act 610.

As shown in cross-sectional view 800, a bulk voltage generation element 402 is formed within the semiconductor substrate 302. In some embodiments, the bulk voltage generation element 402 may comprise a charge pump having a plurality of transistors and capacitive elements. In other embodiments, the bulk voltage generation element 402 may comprise a voltage divider comprising resistive elements. In some embodiments, the capacitive and/or resistive elements may be formed within an ILD layer (not shown) overlying the semiconductor substrate 302 during later acts of the method.

Figure 9:
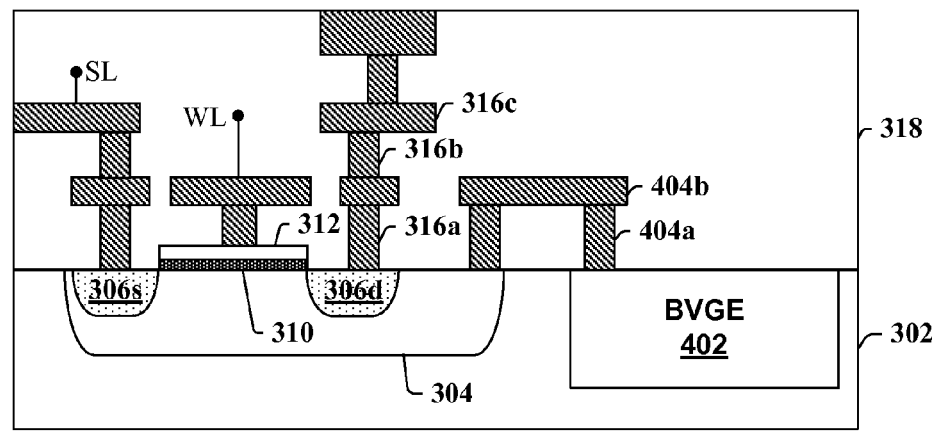

FIG. 9 illustrates some embodiments of a cross-sectional view 900 of an integrated chip corresponding to act 612.

As shown in cross-sectional view 900, a plurality of metal interconnect layers 316a-316c are formed within an ILD layer 318 overlying the semiconductor substrate 302. The plurality of metal interconnect layers 316a-316c may comprise a first plurality of metal interconnect layers coupled to the drain region 306d of the PMOS transistor 303. The plurality of metal interconnect layers 316a-316c may further comprise a first metal interconnect wire comprising a source-line electrically coupled to the source region 306s and a second metal interconnect wire is formed comprising a word-line electrically coupled to the gate electrode 312. In some embodiments, the plurality of metal interconnect layers 316a-316c may further comprise one or more metal interconnect layers 404a-404b configured to electrically connect the bulk voltage generation element 402 to the well region 304.

In various embodiments, the plurality of metal interconnect layers 316a-316c may be formed using a single damascene and/or a dual damascene process. For example, in a dual damascene process a sub-layer of the ILD layer 318 (e.g., a low-k dielectric layer) is formed over the semiconductor substrate 302 by way of a vapor deposition technique. The sub-layer is selectively exposed to an etchant (e.g., $CF_4$, $CHF_3$, $C_4F_8$, HF, etc.) configured to selectively etch sub-layer to form a plurality of via holes and a plurality of metal trenches overlying the plurality of via holes. A metal material is formed in the plurality of via holes and metal trenches. In some embodiments, a deposition process may be used to form a seed layer within the plurality of via holes, followed by a subsequent plating process (e.g., an electroplating process, an electro-less plating process) that forms the metal material to a thickness that fills the plurality of via holes and metal trenches. In some embodiments, a chemical mechanical polishing (CMP) process may be used to remove excess of the metal material from a top surface of the sub-layer of the ILD layer 318.

Figure 10:
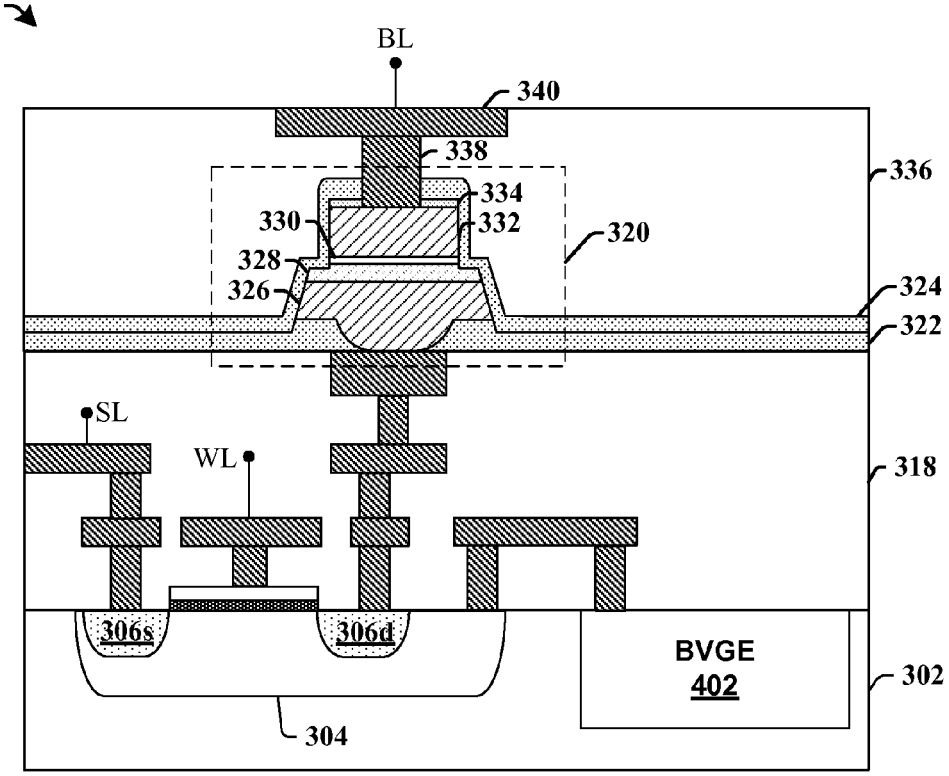

FIG. 10 illustrates some embodiments of a cross-sectional view 1000 of an integrated chip corresponding to act 618.

As shown in cross-sectional view 1000, an RRAM cell 320 is formed over the plurality of metal interconnect layers 316a-316c. The RRAM cell 320 may be formed by selectively depositing a bottom electrode layer, a dielectric data storage layer, a top electrode layer, and a hard mask layer by way of a vapor deposition process (e.g., chemical vapor deposition, physical vapor deposition, etc.). The bottom electrode layer, the dielectric data storage layer, and the top electrode layer may be subsequently etched by way of multiple etching processes to form a bottom electrode 326, a dielectric data storage layer 328, and a top electrode 332.

In some embodiments, a bottom dielectric layer 322 may be deposited onto the ILD layer 318 prior to formation of the RRAM cell 320. In some additional embodiments, a top dielectric layer 324 may be formed over the RRAM cell 320. An upper ILD layer 336 may be subsequently deposited over the top dielectric layer 324 and an upper metal via 338 may be formed within the upper ILD layer 336 to connect the top electrode to an upper metal wire 340 comprising a bit line.

FIG. 11 illustrates some embodiments of schematic diagrams, 1100a and 1100b, of an integrated chip corresponding to act 620. It will be appreciated that the bias voltage values illustrated in schematic diagrams 1100a-1100b are non-limiting examples of voltages values that may be used during the 'forming' operation.

As shown in schematic diagram 1100a, when no bias voltages are applied to the word-line WL, the bit-line BL, and the source-line SL, there is no conductive filament in the dielectric data storage layer 108.

As shown in schematic diagram 1100b, a conductive filament 1102 can be formed in the dielectric data storage layer 108 by performing a 'forming' operation. During the forming operation, the source-line is set to a voltage $V_{SL}$ having a value of substantially zero volts. The word-line WL is set to a voltage $V_{WL}$ having a value of substantially zero volts, which along with the bulk terminal 102b being set to a non-zero voltage $V_B$ (e.g., $V_B \approx 1.0V$), results in a voltage $V_{N1}$ (e.g., $V_{N2} \approx 0.2V$) at a node $N_1$ coupled to the first conductive electrode 106a of the RRAM cell 104. The second conductive electrode 106b is set to a voltage $V_{N2}$ (e.g., $V_{N2} \approx 3V$) that is much greater than a voltage $V_{N1}$, resulting in a potential difference between the first conductive electrode 106a and the second conductive electrode 106b that causes oxygen ion migration into the dielectric data storage layer 108 to initially form the conductive filament 1102.

FIGS. 12A-12B illustrates some embodiments of schematic diagrams, 1200a and 1200b, of an integrated chip corresponding to act 622. After the 'forming' operation is completed, the RRAM cell may be cycled between data states using 'set' and 'reset' operations, as shown in schematic diagrams 1200a and 1200b. It will be appreciated that the voltage values illustrated in schematic diagrams 1200a and 1200b are non-limiting examples of voltages values that may be used during the 'set' and 'reset' operations.

As shown in schematic diagram 1200a, during a reset operation the source-line SL is set to a non-zero voltage $V_{SL}$ (e.g., $V_{SL} \approx 1.8V$) The word-line WL is set to a voltage $V_{WL}$ having a value of substantially zero volts to turn on the PMOS transistor 102, which along with the bulk terminal 102b being set to a non-zero voltage $V_B$ (e.g., $V_B \approx 1.8V$), results in a voltage $V_{N1}$ (e.g., $V_{N2} \approx 1.6V$) at a node $N_1$ coupled to the first conductive electrode 106a of the RRAM cell 104. The second conductive electrode 106b of the RRAM cell 104 is held at a voltage $V_{N2}$ less than $V_{N1}$ (e.g., $V_{N2} \approx 0V$), thereby forming a potential difference between the first and second conductive electrodes, 106a and 106b, which moves ions to the dielectric data storage layer 108, where the ions combine with the vacancies of the conductive filament causing a break 1202 to form in the conductive filament 1102.

As shown in schematic diagram 1200b, during a set operation the source-line SL is set to a voltage $V_{SL}$ having a value of substantially zero volts. The word-line WL is set to a voltage $V_{WL}$ having a value of substantially zero volts, which along with the bulk terminal 102b being set to a non-zero voltage $V_B$ (e.g., $V_B \approx 0V$), results in a voltage $V_{N1}$ (e.g., $V_{N2} \approx 0.5V$) at a node $N_1$ coupled to the first conductive electrode 106a of the RRAM cell 104. The second conductive electrode 106b is held at a voltage of voltage $V_{N2}$ greater than $V_{N1}$ (e.g., $V_{N2} \approx 1.4V$), thereby forming a potential difference between the conductive electrodes that removes ions from the dielectric data storage layer 108, resulting in the formation of vacancies of the conductive filament to reform the conductive filament 1102.

Therefore, the present disclosure relates to an integrated chip comprising an RRAM cell that is driven by a PMOS transistor, and an associated method of formation.

In some embodiments, the present disclosure relates to a method of forming an integrated chip. The method comprises forming a PMOS transistor within a substrate. The method further comprises forming a resistive random access memory (RRAM) cell over the substrate, wherein the RRAM cell has a first conductive electrode that is connected to a drain region of the PMOS transistor and that is separated from a second conductive electrode by a dielectric data storage layer having a variable resistance.

In other embodiments, the present disclosure relates to a method of forming an integrated chip. The method comprises forming a PMOS transistor within a semiconductor substrate. The method further comprises forming a bulk voltage generation element within the semiconductor substrate, wherein the bulk voltage generation element is electrically coupled to a bulk terminal of the PMOS transistor. The method further comprises forming one or more metal interconnect layers within an inter-level dielectric (ILD) layer overlying the semiconductor substrate. The method further comprises forming a resistive random access memory (RRAM) cell, wherein the RRAM cell has a first conductive electrode that is directly coupled to a drain terminal of the PMOS transistor by way of the one or more metal interconnect layers and that is separated from a second conductive electrode by a dielectric data storage layer having a variable resistance.

In yet other embodiments, the present disclosure relates to an integrated chip (IC). The IC comprises a PMOS transistor arranged within a semiconductor substrate. The IC further comprises a resistive random access memory (RRAM) cell arranged within an inter-level dielectric (ILD) layer overlying the semiconductor substrate, wherein the RRAM cell has a first conductive electrode separated from a second conductive electrode by a dielectric data storage layer having a variable resistance. The IC further comprises one or more metal interconnect layers coupled between a drain region of the PMOS transistor and the first conductive electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a PMOS transistor within a substrate;
   forming a resistive random access memory (RRAM) cell over the substrate, wherein the RRAM cell has a first conductive electrode that is connected to a drain terminal of the PMOS transistor and that is separated from a second conductive electrode by a dielectric data storage layer having a variable resistance, wherein forming the RRAM cell comprises:
   forming a bottom dielectric layer over an ILD layer overlying the substrate;
   sequentially depositing a bottom electrode layer, a dielectric data storage layer, a top electrode layer, and a hard mask layer;
   etching the bottom electrode layer, the dielectric data storage layer, and the top electrode layer to form a bottom electrode, a dielectric data storage layer, and a top electrode, wherein the bottom electrode comprises a lower portion surrounded by the bottom dielectric layer and an upper portion;
   forming a top dielectric layer over the top electrode and the bottom dielectric layer;
   forming an upper ILD layer over the top dielectric layer;
   wherein the lower portion has curved sidewalls that cause a lower width of the bottom electrode to decrease as a distance from the substrate decreases, and the upper portion has angled sidewalls that cause an upper width of the bottom electrode to decrease as a distance from the substrate increases;
   wherein a bottom surface of the bottom electrode has a smaller width than a top surface of the bottom electrode; and
   wherein the PMOS transistor is configured to be turned on while a non-zero bias voltage is applied to a bulk terminal of the PMOS transistor to perform a reset operation on the RRAM cell.

2. The method of claim 1, further comprising:
   coupling a source terminal of the PMOS transistor to a first metal interconnect wire comprising a source-line connected to source terminals of one or more additional PMOS transistors within a memory array comprising a plurality of RRAM cells; and
   coupling a gate terminal of the PMOS transistor to a second metal wire comprising a word-line connected to gate terminals of the one or more additional PMOS transistors within the memory array.

3. The method of claim 2, wherein the RRAM cell is configured to perform a set operation by receiving a substantially zero bias voltage at the word-line and concurrently receiving the non-zero bias voltage at the bulk terminal of the PMOS transistor.

4. The method of claim 2,
   wherein the source-line and the bulk terminal are configured to receive a substantially same voltage during the reset operation to change the dielectric data storage layer from a low resistive state to a high resistive state; and
   wherein the dielectric data storage layer has a larger resistance in the high resistive state than in the low resistive state.

5. The method of claim 1, wherein the first conductive electrode of the RRAM cell is configured to receive a first non-zero voltage, a gate terminal and a source terminal of the PMOS transistor are configured to receive a zero voltage, and the bulk terminal is configured to receive the non-zero bias voltage during performance of a set operation to change the dielectric data storage layer from a high resistive state to a low resistive state.

6. The method of claim 1, wherein the PMOS transistor comprises:
   a well region disposed within a semiconductor substrate and having n-type dopants;
   a source region disposed within the well region and having p-type dopants;
   a drain region disposed within the well region and having p-type dopants; and
   a gate electrode arranged over the well region at a location laterally between the source region and the drain region.

7. The method of claim 1, wherein the non-zero bias voltage is generated by a bulk voltage generation element comprising a charge pump or a voltage divider connected to the bulk terminal.

8. The method of claim 1, wherein the non-zero bias voltage applied to the bulk terminal of the PMOS transistor is greater than a voltage at the drain terminal of the PMOS transistor during a set operation and during the reset operation.

9. The method of claim 1,
wherein a gate terminal and a source terminal of the PMOS transistor are configured to receive a substantially zero voltage, the bulk terminal is configured to receive the non-zero bias voltage, and the second conductive electrode is configured to receive a second non-zero voltage, during a forming operation to form an initial conductive filament within the dielectric data storage layer; and
wherein the substantially zero voltage applied to the gate terminal turns on the PMOS transistor.

10. A method of forming an integrated chip, comprising:
forming a PMOS transistor within a substrate;
forming a resistive random access memory (RRAM) cell over the substrate, wherein the RRAM cell has a first conductive electrode that is connected to a drain terminal of the PMOS transistor and that is separated from a second conductive electrode by a dielectric data storage layer having a variable resistance, wherein forming the RRAM cell comprises:
forming a bottom dielectric layer over an ILD layer overlying the substrate;
sequentially depositing a bottom electrode layer, a dielectric data storage layer, a top electrode layer, and a hard mask layer;
etching the bottom electrode layer, the dielectric data storage layer, and the top electrode layer to form a bottom electrode, a dielectric data storage layer, and a top electrode, wherein the bottom electrode comprises lower portion surrounded by the bottom dielectric layer and an upper portion;
forming a top dielectric layer over the top electrode and the bottom dielectric layer;
forming an upper ILD layer over the top dielectric layer;
wherein the lower portion has curved sidewalls that cause a lower width of the bottom electrode to decrease as a distance from the substrate decreases, and the upper portion has angled sidewalls that cause an upper width of the bottom electrode to decrease as a distance from the substrate increases;
wherein a bottom surface of the bottom electrode has a smaller width than a top surface of the bottom electrode; and
wherein the PMOS transistor is configured to be turned on while a non-zero bias voltage is applied to a bulk terminal of the PMOS transistor to perform a reset operation on the RRAM cell, and wherein a source line and the bulk terminal are configured to receive a substantially same voltage during the reset operation to change the dielectric data storage layer from a low resistive state to a high resistive state.

11. The method of claim 10, further comprising:
coupling a source terminal of the PMOS transistor to a first metal interconnect wire.

12. The method of claim 10, further comprising:
coupling a gate terminal of the PMOS transistor to a second metal wire.

13. The method of claim 10, wherein the PMOS transistor comprises:
a well region disposed within a semiconductor substrate and having n-type dopants;
a source region disposed within the well region and having p-type dopants;
a drain region disposed within the well region and having p-type dopants; and
a gate electrode arranged over the well region at a location laterally between the source region and the drain region.

14. The method of claim 13, further comprising:
forming a bulk voltage generation element within the substrate.

15. The method of claim 14, further comprising:
coupling the bulk voltage generation element to the well region by way of one or more metal interconnect wires.

16. The method of claim 14, wherein the bulk voltage generation element comprising a charge pump or a voltage divider connected to the bulk terminal.

17. A method of forming an integrated chip, comprising:
forming a PMOS transistor within a substrate;
forming a resistive random access memory (RRAM) cell over the substrate, wherein the RRAM cell has a first conductive electrode that is connected to a drain terminal of the PMOS transistor and that is separated from a second conductive electrode by a dielectric data storage layer having a variable resistance, wherein forming the RRAM cell comprises:
forming a bottom dielectric layer over an ILD layer overlying the substrate;
sequentially depositing a bottom electrode layer, a dielectric data storage layer, a top electrode layer, and a hard mask layer;
etching the bottom electrode layer, the dielectric data storage layer, and the top electrode layer to form a bottom electrode, a dielectric data storage layer, and a top electrode, wherein the bottom electrode comprises lower portion surrounded by the bottom dielectric layer and an upper portion;
forming a top dielectric layer over the top electrode and the bottom dielectric layer;
forming an upper ILD layer over the top dielectric layer;
wherein the lower portion has curved sidewalls that cause a lower width of the bottom electrode to decrease as a distance from the substrate decreases, and the upper portion has angled sidewalls that cause an upper width of the bottom electrode to decrease as a distance from the substrate increases;
wherein a bottom surface of the bottom electrode has a smaller width than a top surface of the bottom electrode; and
wherein the PMOS transistor is configured to be turned on while a non-zero bias voltage is applied to a bulk terminal of the PMOS transistor to perform a reset operation on the RRAM cell, and wherein the non-zero bias voltage applied to the bulk terminal of the PMOS transistor is greater than a voltage at the drain terminal of the PMOS transistor during the reset operation.

18. The method of claim 17, further comprising:
coupling a source terminal of the PMOS transistor to a first metal interconnect wire.

19. The method of claim 17, further comprising:
coupling a gate terminal of the PMOS transistor to a second metal wire.

20. The method of claim 17, wherein the PMOS transistor comprises:
a well region disposed within a semiconductor substrate and having n-type dopants;
a source region disposed within the well region and having p-type dopants;
a drain region disposed within the well region and having p-type dopants; and a gate electrode arranged over the well region at a location laterally between the source region and the drain region.

\* \* \* \* \*